United States Patent [19]

Plourde et al.

[11] Patent Number: 4,669,085
[45] Date of Patent: May 26, 1987

[54] ELECTRO-OPTICAL MODULATOR FOR AN ELECTRO-OPTICALLY MODULATED LASER

[75] Inventors: Bertrand E. Plourde, Scituate; Michael E. Mack, Manchester, both of Mass.

[73] Assignee: The United States of America as represented by the Secretary of the Navy, Washington, D.C.

[21] Appl. No.: 241,309

[22] Filed: Mar. 6, 1981

[51] Int. Cl.$^4$ ............................................. H01S 3/115
[52] U.S. Cl. ....................................... 372/12; 372/25; 372/38
[58] Field of Search ......................... 372/12, 25, 38, 26

[56] References Cited

U.S. PATENT DOCUMENTS

| | | | |
|---|---|---|---|
| 3,701,956 | 10/1972 | Simmons | 372/12 |
| 3,757,249 | 9/1973 | Carmine, Jr. et al. | |
| 3,783,403 | 1/1974 | Hook et al. | |
| 3,783,406 | 1/1974 | Hook et al. | |
| 3,815,046 | 5/1974 | Johnson et al. | |
| 3,818,373 | 6/1974 | Chun et al. | 372/12 |

OTHER PUBLICATIONS

"Transient Elastooptic Effects and Q-Switching Performance in Lithium Niobate and KD*P Pockels Cells," Hilberg and Hook, Journal of Appl. Optics, vol. 9, No. 8, pp. 1939–1940 (Aug. 1970).

Primary Examiner—Léon Scott, Jr.
Attorney, Agent, or Firm—Prithvi C. Lall; Arthur A. McGill; Michael J. McGowan

[57] ABSTRACT

The present invention provides a jitter stable electro-optical modulator for modulating a high power, repetitively pulsed laser having an optical risetime (10% to 90%) of the order of nanoseconds. The electro-optical modulator includes a birefringent electro-optical device; a hydrogen thyratron operated at a preselected high pressure and having an "ON" and an "OFF" state; first means responsive to the "ON" state of the thyratron for impressing a first preselected voltage across the birefringent electro-optical device; second means responsive to the "OFF" state of the hydrogen thyratron for impressing a second preselected voltage across the electro-optical modulator at a time coincident with the laser buildup interval; and means for repetitively driving the hydrogen thyratron into the "ON" and the "OFF" states repetitively at a preselected repetition rate. The selectively pressurized hydrogen thyratron is placed within a close-fitting vented copper housing and is electrically connected across the electrodes of the birefringent device by an impedance matching network and a coaxial cable.

5 Claims, 3 Drawing Figures 5 ns/cm 20 ns/cm

ELECTRO-OPTICAL MODULATOR FOR AN ELECTRO-OPTICALLY MODULATED LASER

This invention is drawn to the field of pulsed lasers, and more particularly, to electro-optical modulators for such lasers.

Related U.S. Pat. No. 3,757,249, issued Sept. 4, 1973 to Carmine, Jr. et al and No. 3,815,046, issued May 4, 1974 to Johnson et al, both of which are incorporated herein by reference, are directed to lasers utilizing a Q-switching modulator technique. In the former, the optical cavity is switched by shorting a biasing potential across an electrooptical modulator from its half wave retardation value to ground, and in the latter, the switching is accomplished by repetitively shorting a biasing potential through ground by applying an alternating voltage thereacross. Optically, the swing through zero accomplishes a phase change of the birefringent electro-optical modulator. In this manner, the state of the applied voltage controls the optical transmission characteristics of the electro-optical modulator and is synchronized in time with the laser buildup interval in the lasing medium whereby a pulse of high intensity light energy is selectively passed out of the optical cavity. Typically, the half wave retardation potential of such lasers is of the order of five (5) to eight (8) kilovolts.

U.S. Pat. No. 3,783,406, issued Jan. 1, 1974 to Hook et al, incorpoated herein by reference, provides an electro-optical modulator for a laser which operates at much lower voltages, and employs a solid-state switch taking advantage of the fact that electro-optical modulation efficiency can be maintained as long as the loss in the cavity is low during the short interval of time that the output pulse is actually coming out of the optical cavity. A SCR (Silicon Controlled Rectifier) selectively gates the voltage of a blocking capacitor through the primary winding of a transformer such that the voltage developed across the secondary winding selectively biases the electro-optical modulator providing for a lasing pulse. Rather than switching to ground potential during the state of optical transmission, Hook biases the electro-optical modulator to a preselected second non-zero voltage to effect maximum lasing efficiency as has been reported in the article, which is incorporated herein by reference, entitled "Transient Elastooptic Effects and Q-Switching Performance in Lithium Niobate and KD*P Pockels Cells", by Hilberg and Hook, appearing in the Journal of Applied Optics, at Volume 9, No. 8, pp. 1939–1940 (August 1970). U.S. Pat. No. 3,783,403, issued Jan. 1, 1974, to Hook et al, incorporated herein by reference, like the last named patent, employs a second preselected biasing voltage during switching of the optical cavity and provides for successive optical pumping bursts during the lasing time of the laser thereby providing double pulses during a single lasing period.

However, a considerable loss of lasing efficiency at high powers is encountered by the known electro-optical modulators. This loss is due, among other factors, to the mismatch between the lasing buildup interval and the circuit electrical time delays which characterize the operation of known electro-optical modulators, which, when combined with circuit instabilities including jitter and short component lifetimes, limits the utility of the known electro-optical modulators in optical applications calling for high power and pulse repetition rates.

SUMMARY OF INVENTION

The present invention overcomes the deficiencies of the prior art by providing a jitter stable electro-optical modulator for modulating a laser having an optical risetime (10% to 90%) of the order of nanoseconds thereby insuring lasing efficiency at high power levels over a wide pulse repetition rate. The electro-optical modulator circuitry of the present invention includes a birefringent electro-optical device; a hydrogen thyratron operated at a preselected high pressure and having an "ON" and an "OFF" state; first means responsive to the "ON" state of the thyratron for impressing a first preselected voltage across the birefringent electro-optical device; second means responsive to the "OFF" state of the hydrogen thyratron for impressing a second preselected voltage across the electrooptical modulator at a time coincident with the laser buildup interval; and means for repetitively driving the hydrogen thyratron into the "ON" and the "OFF" states repetitively at a preselected repetition rate. The anode to cathode fall time or commutation interval of the selectively pressurized hydrogen thyratron is such that an electrical bias signal is applied across the birefringent device in a time that corresponds to the laser buildup interval thereby insuring maximum lasing efficiency at selected high power levels and repetition rates.

According to one feature of the preferred embodiment, the selectively pressurized hydrogen thyratron is placed within a close-fitting vented copper housing and is electrically connected across the electrodes of the birefringent device by an impedance matching network and a coaxial cable. The impedance matching network is selected to insure quick ionization of the pressurized hydrogen gas filling the thyratron which helps to provide a rapid anode to cathode fall time of the order of a few nanoseconds ($10^{-9}$s).

According to another feature of the preferred embodiment, a trigger network is connected across the grid and the cathode electrodes of the selectively pressurized hydrogen thyratron and includes a pulse source connected in the primary windings of a grid transformer the amplified secondary winding of which is connected across a limiting resistor to the grid and the cathode electrodes of the thyratron. A network of voltage variable transformers selectively controls a pressure filament internally disposed in parallel with the hot cathode filament of the selectively pressurized hydrogen thyratron.

Accordingly, it is a general object of the present invention to provide an electro-optical modulator for a laser.

It is a related object of this invention to provide such a modulator that has an optical switch time of the order of a few nanoseconds.

It is another related object of the present invention to provide such an electro-optical modulator for a high power, high repetition rate laser.

Other objects, advantages, and novel features of the present invention will become apparent by reference to the appended claims, to the following detailed description of the invention and the drawings, wherein like parts are similarly designated throughout, and wherein:

DETAILED DESCRIPTION OF THE PREFERRED EMBODIMENT

Figure 1:
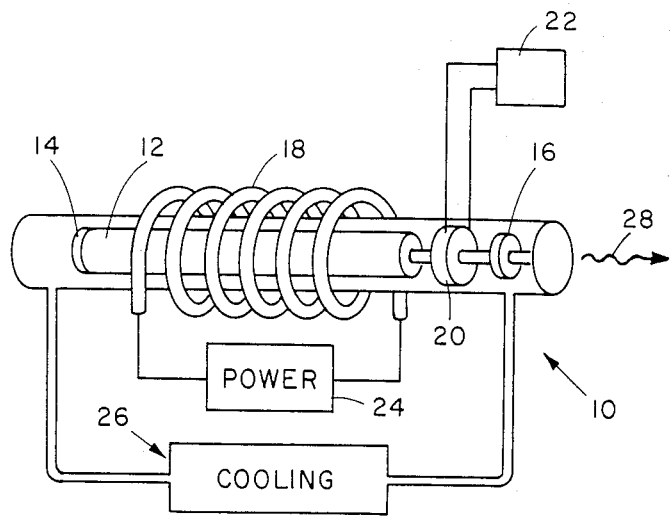
FIG. 1 is a stylized block diagram of the electro-optically modulated laser of the present invention.

Referring now to FIG. 1, generally shown at 10 is a stylized block diagram of the electro-optically modulated laser according to the present invention. A long, narrow column of lasing medium 12 is terminated on both ends by reflecting etalons such as small mirrors 14 and 16 facing each other. Etalon 14 typically provides one hundred (100) percent reflectivity and may be a completely silvered mirror and etalon 16 typically provides fifty (50) percent reflectivity and may be a partially silvered mirror.

The sides of the lasing medium 12 admit the energy from a suitable pump 18 which may be a pulsed gas discharge of high intensity. The pump may be wound around the lasing medium 12 as shown, positioned alongside or focused on it by a mirror, not shown. An electro-optical modulator 20, which commonly includes a linear polarizer and an electro-optical birefringent device, such as a longitudinal field KD*P pockels cell or a lithium niobate crystal, is positioned between the lasing medium 12 and etalon 16. A modulator control or driver 22 is operatively connected to the modulator 20 and selectively controls the optical transmission properties of the modulator 20. A power source 24, which is synchronized with the driver 22, controls the pumping of the lasing medium 12 by the pump 18 and a cooling system 26 stabilizes the temperature of the laser.

Depending upon the optical state of the birefringent electro-optical modulator 20, which is in turn controlled by the driver 22, the electro-optically modulated laser 10 repetitively emits pulses 28 of laser light lasting but a fraction of a second and having a peak power of the order of several hundred thousand kilowatts. At such high power levels, as discussed in the background of the invention, repetitively pulsed lasing efficiency is insured by the present invention by providing a jitter stable electro-optical modulator that switches on the order of nanoseconds between a first preselected voltage to a second preselected voltage in a time interval that corresponds to the laser buildup time.

Figure 2:
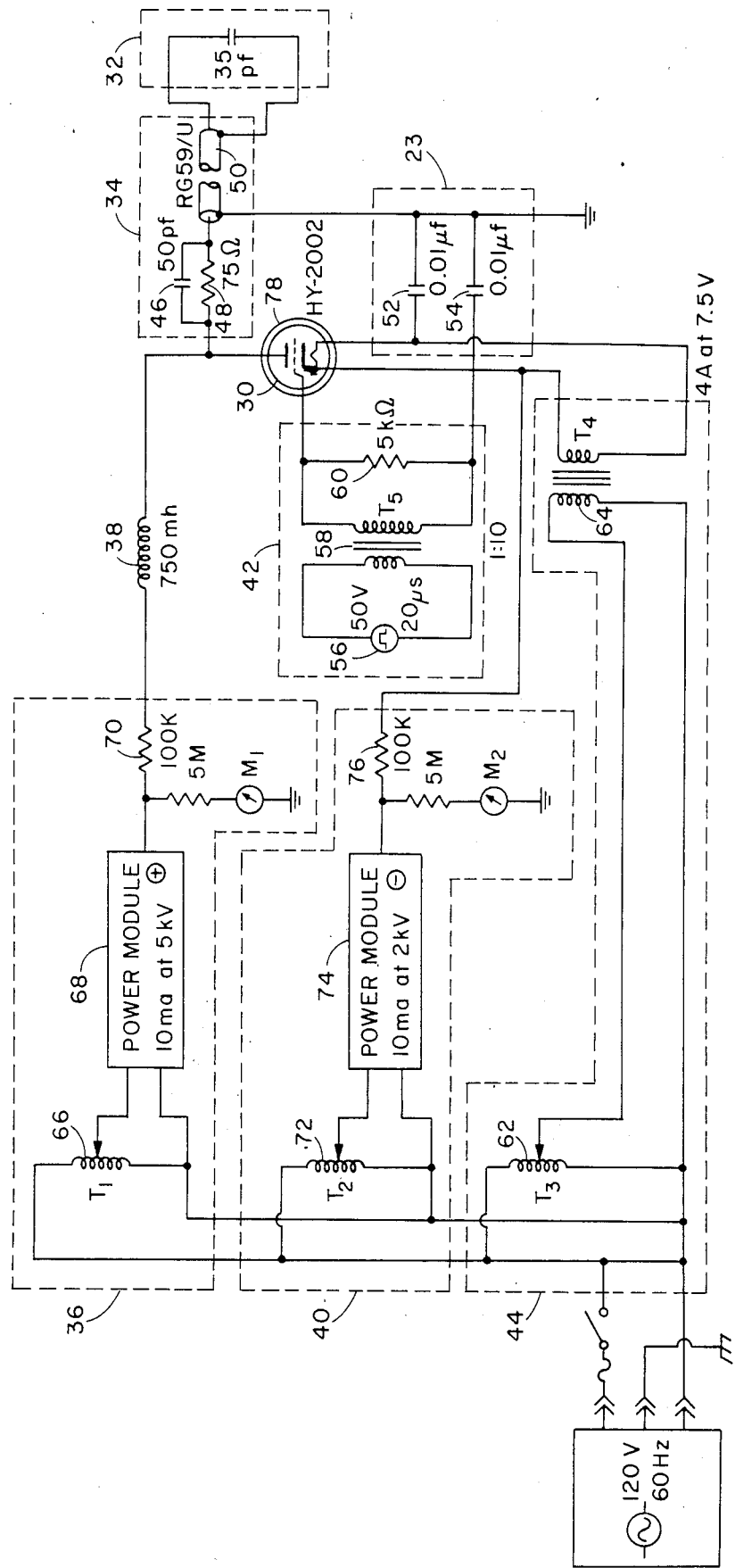
FIG. 2 is a circuit block diagram of the electro-optical modulator of the present invention.

Referring now to FIG. 2, which shows a block circuit diagram of the novel driver 22 of the present invention, a selectively pressurized hydrogen thyratron 30 has its anode electrode connected to one electrode of an electro-optical birefringment device 32, a longitudinal field KD*P pockels cell in the preferred embodiment, through an impedance matching network 34 and has its cathode electrode connected through filter capacitors 23 to electrical ground. The other electrode of the electrooptical device 32 is also connected to ground. A first source of a preselected DC potential 36 is connected through an isolating inductor 38 to the anode electrode of the selectively pressurized hydrogen thyratron 30. A second source of preselected DC potential 40 is connected to the cathode electrode of the thyratron 30. A trigger network 42 is connected between the grid and the cathode electrodes of the selectively pressurized hydrogen thyratron 30 and drives the thyratron repetitively into its "ON", i.e. conducting state. A hydrogen pressure control circuit 44 is connected to selectively pressurized hydrogen thyratron 30 to control the hydrogen reservoir heater voltage to obtain a desired operating pressure.

In the preferred switch-off mode, impedance network 34 includes a shunt arrangement of a capacitor 46 and a resistor 48 connected in series with a coaxial cable 50 and filter 23 consists of capacitors 52 and 54 respectively connected between the internal hydrogen pressure control filament and ground and the hydrogen thyratron cathode electrode and ground.

Trigger 42 includes a pulse source 56 connected in the primary winding of a transformer 58 the amplified secondary winding of which is connected across a current limiting resistor 60 which is connected in turn across the grid and cathode electrodes of the hydrogen thyratron 30.

Hydrogen pressure control circuit 44 includes an autotransformer 62 connected in the primary winding of a transformer 64 the secondary winding of which is connected across a hydrogen reservoir heating element to adjust the hydrogen reservoir heating voltage to obtain a desired operating pressure.

Selectively pressurized hydrogen thyratron 30 operates at a higher pressure than heretofore existing tubes in order to reduce the anode to cathode fall time (commutation time). The very strong dependence of commutation time on gas pressure is explained in the article entitled "Hydrogen Thyratrons", by Goldberg and Rothstein, appearing at volume 14, Advances in Electronics and Electron Physics, at pp. 227 to 239 (1961), and is incorporated herein by reference. The selectively pressurized hydrogen thyratron 30 of the present invention, designated the HY-2002 and now available as a result of the teaching of the present invention from EGG, has a commutation time less than 5 nanoseconds. It should be noted, however, that the increase in tube pressure not only provides a reduction in the commutation interval but also reduces tube hold-off capability. It has been found that this is adequate to achieve half wave switching with longitudinal field KD*P pockels cells in the visible region of the spectrum and quarter wave switching into the near infrared.

The first means 36 for applying a preselected voltage across the birefringent electro-optical modulator 32 includes an autotransformer 66 the output winding of which is connected to a power module 68 connected in turn to a current limiting resistor 70 which is connected in turn to the anode electrode of the hydrogen thyratron 30 through the isolating inductor 38. In a like manner, the second means 40 for applying a second preselected voltage across the birefringent electro-optical modulator 32 includes an autotransformer 72 the output winding of which is connected to a power module 74 connected in turn through a current limiting resistor 76 to the cathode electrode of the selectively pressurized hydrogen thyratron 30. It should be noted that the power modules 68 and 74 are available as part numbers HV50-103M and HV25-103M, respectively, from Plastic Capacitors, Inc.

In the circuit configuration shown in FIG. 2, the hydrogen thyratron 30 is placed within a close-fitting, vented copper housing, shown schematically at 78, which serves as a low-inductance coaxial current return.

In operation, prior to the application of a pulse from trigger 42, the hydrogen thyratron is in its "OFF" state and does not permit current to pass therethrough in either direction. Thus, in the "OFF" state, the preselected voltage provided by the first means 36 appears across the birefringent electrooptical modulator 32. In response to a pulse from pulse source 56, the grid electrode of the hydrogren thyratron 30 triggers ionization of the hydrogen gas and the tube becomes conducting, i.e. is placed in the "ON" state. In response to being in the "ON" state, the voltage across the birefringent electro-optical device 32 is switched to the second preselected voltage provided by the second means 40 in order to counteract the elasto-optic effects induced in the birefringent electro-optical device 32 as discussed in the background of the invention. The optimal value of the negative bias voltage varies with the type of the device 32 and with the pulse repetition rate.

Figure 3:
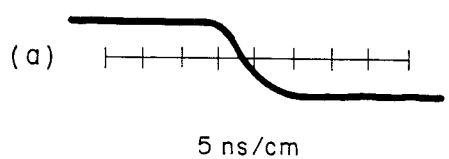
FIG. 3 shows graphs useful in explaining the operation of the electro-optically modulated laser of the present invention.
Figure 3:
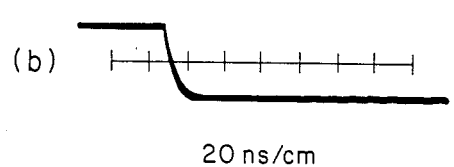

As can be seen by referring to FIG. 3(a), the anode to cathode fall time of the hydrogen thyratron for the parameter values specified in FIG. 2 is such that the voltage across the birefringent electro-optical device switches from a state of one hundred (100) percent optical transmission to zero (0) percent transmission in a time period (10% to 90%) on the order of six (6) nanoseconds. Thus, maximum lasing efficiency is insured for high power applications by having the anode to cathode fall time correspond to the laser buildup interval. As can be seen in FIG. 3(b), which shows the waveform of FIG. 3(a) on a spatially displaced and expanded time scale, the waveform remains substantially free of oscillations and reflections for the duration of the expanded time scale. It has been found that such constant performance with the electro-optically modulated laser of the present invention can be achieved at pulse repetition rates on the order of 1000 hz.

During the interpulse interval provided by the pulse source 56, selectively pressurized hydrogen thyratron 30 is extinguished by maintaining the anode electrode at less than the critical ignition voltage for a period longer than the recovery time of the selectively pressurized hydrogen thyratron. A suitable voltage is maintained by such a choice of design parameters that an inverse voltage appears across the hydrogen thyratron which allows the ionized hydrogen plasma to decay to the tube walls by means of a diffusion process. During the interpulse interval, the anode voltage increases from its inverse value to the peak forward value and recovers for the next pulse repetition, and the cycle is repeated.

In summary, a high repetition rate electro-optically modulated laser is provided employing a selectively pressurized hydrogen thyratron disposed with a close-fitting vented copper housing having an anode to cathode fall time of the order of nanoseconds providing maximum lasing efficiency for high power lasers over a wide pulse repetition rate.

We wish it to be clearly understood that the parameters specified herein are exemplary rather than limitative and that many modifications of the presently disclosed invention are possible. For example, the characteristics of an electrooptical modulator of the lithium niobate type are such as to require a second preselected voltage that is positive rather than negative. In addition, it may be desirable to operate the driver in a switch-on mode, rather than the switch-off mode described above, simply by inserting a blocking capacitor in series with the coaxial cable driving the birefringent electrooptical modulator 32. The additional impedance of the capacitor, however, degrades rise time but rise times below 10 nanoseconds are still readily achieved.

We wish it to be understood that we do not want to be limited to the exact details of construction as shown and described hereinabove.

What is claimed is:

1. In an electro-optically modulated laser, comprising a lasing medium, a pair of spaced etalons and a birefringent electro-optical device arranged in an optical cavity an improved electro-optical modulator which includes:
   a hydrogen thyratron having an "ON" and an "OFF" state;
   means for selectively pressurizing said hydrogen thyratron;
   means, responsive to said "OFF" state of said hydrogen thyratron, for impressing a first preselected voltage across said birefringent electro-optical device;
   means, responsive to said "ON" state of said hydrogen thyratron, for impressing a second preselected voltage across said birefringent electro-optical device in a time that corresponds to the laser buildup interval; and
   means for repetitively driving said hydrogen thyratron into said "ON" and said "OFF" states.

2. The improved electrooptical modulator as recited in claim 1, wherein said means for repetitively driving said hydrogen thyratron into said "ON" and said "OFF" states includes a pulse source connected in the primary winding of a transformer the secondary winding of which is operatively connected across the grid-cathode electrodes of said hydrogen thyratron.

3. The improved electrooptical modulator as recited in claim 1, wherein said means for selectively pressurizing said hydrogen thyratron includes a hydrogen pressure control filament carried by said hydrogen thyratron and a network of voltage variable transformers operatively connected to said hydrogen pressure control filament.

4. The improved electrooptical modulator as recited in claims 2 or 3, wherein said means for impressing a first preselected voltage includes a first power module, an impedance matching network and a coaxial cable.

5. The improved electrooptical modulator as recited in claims 2, or 3, wherein said means for impressing a second preselected voltage includes an autotransformer and a second power module.

* * * * *